(12) United States Patent
Yang et al.

(10) Patent No.: US 9,859,522 B2
(45) Date of Patent: Jan. 2, 2018

(54) METHOD FOR PACKAGING AN ORGANIC LIGHT EMITTING DIODE AND A DISPLAY DEVICE USING THE SAME

(71) Applicant: Shenzhen China Star Optoelectronics Technology Co., Ltd., Shenzhen (CN)

(72) Inventors: Qingdou Yang, Shenzhen (CN); Yawei Liu, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 6 days.

(21) Appl. No.: 14/774,133

(22) PCT Filed: Jun. 29, 2015

(86) PCT No.: PCT/CN2015/082669
§ 371 (c)(1),
(2) Date: Sep. 10, 2015

(87) PCT Pub. No.: WO2016/206125
PCT Pub. Date: Dec. 29, 2016

(65) Prior Publication Data
US 2016/0380228 A1 Dec. 29, 2016

(30) Foreign Application Priority Data

Jun. 23, 2015 (CN) .......................... 2015 1 0349610

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3244* (2013.01); *H01L 51/524* (2013.01); *H01L 51/56* (2013.01)

(58) Field of Classification Search
CPC combination set(s) only.
See application file for complete search history.

(56) References Cited

U.S. PATENT DOCUMENTS

| | | | |
|---|---|---|---|
| 2007/0176548 A1* | 8/2007 | Kim | H01L 51/5246 313/512 |
| 2012/0111059 A1* | 5/2012 | Watanabe | C03C 8/24 65/43 |
| 2012/0200851 A1* | 8/2012 | Wu | G01N 21/658 356/301 |
| 2016/0164025 A1 | 6/2016 | Liu | |

FOREIGN PATENT DOCUMENTS

| | | |
|---|---|---|
| CN | 102403466 | 4/2012 |
| CN | 103383992 | 11/2013 |
| JP | 2005-222789 | 8/2005 |

* cited by examiner

Primary Examiner — Kyoung Lee
Assistant Examiner — Ratisha Mehta

(57) ABSTRACT

The present invention discloses a method for packaging an organic light emitting diode: allocating a position for attaching a glass cloth tape on the packaging substrate; attaching the glass cloth tape on the position; bonding an organic light emitting diode substrate to the packaging substrate; melting the glass cloth tape, so that the organic light emitting diode substrate welds together with the packaging substrate. The present invention can avoid the presence of a welding gap, so that external gas cannot enter into an internal part of the packaging body, thereby increasing the service life of the OLED device.

7 Claims, 4 Drawing Sheets

METHOD FOR PACKAGING AN ORGANIC LIGHT EMITTING DIODE AND A DISPLAY DEVICE USING THE SAME

RELATED APPLICATIONS

This application is a National Phase of PCT Patent Application No. PCT/CN2015/082669 having International filing date of Jun. 29, 2015, which claims the benefit of priority of Chinese Patent Application No. 201510349610.7 filed on Jun. 23, 2015. The contents of the above applications are all incorporated by reference as if fully set forth herein in their entirety.

TECHNICAL FIELD OF THE INVENTION

The present invention relates to the technical field of displays, and more particularly to a method for packing an organic light emitting diode and a display device using the same.

BACKGROUND OF THE INVENTION

In the technical field of displays, flat-panel display technology (for example, LCDs and OLEDs) has been gradually replacing CRT displays. Plane light source technology is a novel light source, the technical development thereof has been approaching to a level of mass production for the market. In the flat-panel display and the plane light source technologies, bonding and welding of the two flat glasses is an important technology, the sealing effect will directly influence the performance of the device.

Ultraviolet (UV) curing technology is used to package an LCD/OLED, which has the following characteristics: no solvent or a small amount of solvent is used, and therefore the solvent pollution to the environment is reduced; low energy consumption, low temperature curing is possible, so it is suitable for heat-sensitive material; rapid curing speed, high efficiency, it is able to be used in high-speed production lines, and the curing equipment occupies a small area. However, since a UV sealant is an organic material, the intermolecular gap becomes larger after being cured, and it is easier for moisture and oxygen reaches the inner sealing area through the medium. Therefore, it is more suitable for applications which are less sensitive to moisture and oxygen, such as LCD. However, it is not appropriate for an OLED which is more sensitive to moisture and oxygen.

Frit packaging technology is a currently developed new type of flat glass sealing technology, in which the frit is blend into a solution of a certain viscosity, coated on a packaging glass, and heated to remove the solvent, and then the packaging glass is bonded with a glass to be packaged, a laser is used to immediately melt the frit, thereby two plate glasses are bonded together. Since frit technology is an inorganic packing medium, its ability of preventing moisture and oxygen is very strong, and is particularly suitable for moisture-sensitive and oxygen-sensitive OLED technology. However, frit packaging technology requires processes of coating sealant and heating to remove the solvent, and standards for these two processes are very critical, so it is not easy to achieve.

Therefore, it is necessary to propose a new technical solution to solve the above technical problems.

SUMMARY OF THE INVENTION

The purpose of the present invention is to provide a method for packaging an organic light emitting diode and a display device using the same, the purpose provides solution to solve the problem existing in using frit packaging technology requires processes of coating sealant and heating to remove, and standards for these two processes are very critical, so it is not easy to achieve.

To solve these problems, the technical means of the present invention are as follows:

A method for packaging an organic light emitting diode, wherein the method comprises the steps of:
providing a packaging substrate;
allocating a position for attaching a glass cloth tape on the packaging substrate;
attaching the glass cloth tape on the position; and
bonding an organic light emitting diode substrate to the packaging substrate wherein the organic light emitting diode substrate has the organic light emitting diode disposed thereon;
welding the organic light emitting diode substrate and the packaging substrate together by using a laser to melt the glass cloth tape.

Preferably, in the method for packaging an organic light emitting diode, a step after allocating the position for attaching the glass cloth tape on the packaging substrate, comprises the step of:
forming a recess on the position; and
the step of attaching the glass cloth tape on the position, which comprises:
attaching the glass cloth tape in the recess.

Preferably, in the method for packaging an organic light emitting diode, the step of 1 melting the glass cloth tape by the laser comprises:
using a carbon dioxide laser with a wavelength range of 800 nm~1200 nm, adjusting the focal length and a focal spot sizes and the laser energy intensity thereof, so that the focal spot falls on the glass cloth tape, moving the focal spot of the carbon dioxide laser along the glass cloth tape, so that the organic light emitting diode substrate and the packaging substrate are welded together.

A method for organic light emitting diode packaging, wherein the method comprises the steps of:
providing a packaging substrate;
allocating a position for attaching a glass cloth tape on the packaging substrate;
attaching the glass cloth tape on the position;
bonding an organic light emitting diode substrate to the packaging substrate; and
melting the glass cloth tape, so that the organic light emitting diode substrate welds together with the packaging substrate.

Preferably, in the method for packaging an organic light emitting diode, a step after allocating a position for attaching a glass cloth tape on the packaging substrate, comprises the step of:
forming a recess on the position; and
the step of attaching the glass cloth tape on the position, which comprises:
attaching the glass cloth tape in the recess.

Preferably, in the method for packaging an organic light emitting diode, the step of melting the glass cloth tape comprises:
melting the glass cloth tape by a laser.

Preferably, in the method for packaging an organic light emitting diode, the step of laser melting the glass cloth tape comprises:
using a carbon dioxide laser with a wavelength range of 800 nm~1200 nm, adjusting the focal length and focal spot sizes and the laser energy intensity, so that the focal spot falls on the glass cloth tape, moving the focal spot of the carbon dioxide laser along the glass cloth tape, so that the organic light emitting diode substrates weld together with the packaging substrate.

A display device, wherein the display device comprises: an organic light emitting diode substrate, a packaging substrate, an organic light emitting diode disposed between the organic light emitting diode substrate and the packaging substrate, and a glass cloth tape, the glass cloth tape being located between the organic light emitting diode substrate and the packaging substrate, and being located around the organic light emitting diode.

Preferably, in the display device, a recess is disposed on the packaging substrate or the organic light emitting diode substrate, the glass cloth tape is located in the recess.

Preferably, in the display device, the glass cloth tape melting point is below 900° C.

Preferably, in the display device, a thickness of the glass cloth tape is from 3 microns to 50 microns.

Preferably, in the display device, the width of the glass cloth tape is from 200 microns to 2000 microns.

Preferably, in the display device, the material of the glass cloth tape is the same as the material of the organic light emitting diode substrate and/or the packaging substrate.

Compared to the prior art, the present invention provides the glass cloth tape which is attached on the packaging substrate, the organic light emitting diode substrate and the packaging substrate are bonded together by using laser welding, so that the organic light emitting diode is sealed between the organic light emitting diode substrate and the packaging substrate. Since the glass cloth tape is smooth, the organic light emitting diode substrate contacts the packaging substrate fully to avoid the appearance of welding cracks, so that outside gas cannot enter the interior of the package, which can effectively prevent moisture and oxygen from entering into the interior packaging body, thereby improving the lifetime of the OLED device. The glass cloth tape is readily available on the market, and is cheap, therefore, it can effectively reduce welding costs of OLED. Furthermore, using glass cloth tape welding, the frit processes of coating sealant and frit processes of heating and drying can be omitted, and significantly improving the sealing effect for moisture and oxygen, which is easy to implement.

To make the present invention more clearly comprehensible, preferred embodiments, with the accompanying drawings, are described in detail below.

DETAILED DESCRIPTION OF THE INVENTION

Regarding the terms used in this specification, "an embodiment" means serving as an example, an illustration or an example. In addition, in the specification and the appended claims, the use of the articles "a" and "an" can be generally interpreted to mean "one or more", unless specified otherwise, or clearly oriented from the context above or below towards the singular form.

In the present invention, by way of using a glass cloth tape, the organic light emitting diode substrate and the packaging substrate are bonded together to seal the organic light emitting diode between the organic light emitting diode substrate and the packaging substrate. Thus, using the method for packaging an organic light emitting diode, which the present invention provides, the frit processes of coating sealant and frit processes of heating and drying can be omitted.

To illustrate the technical solution of the present invention, it will be described by the following specific embodiments.

Embodiment 1

Figure 1:
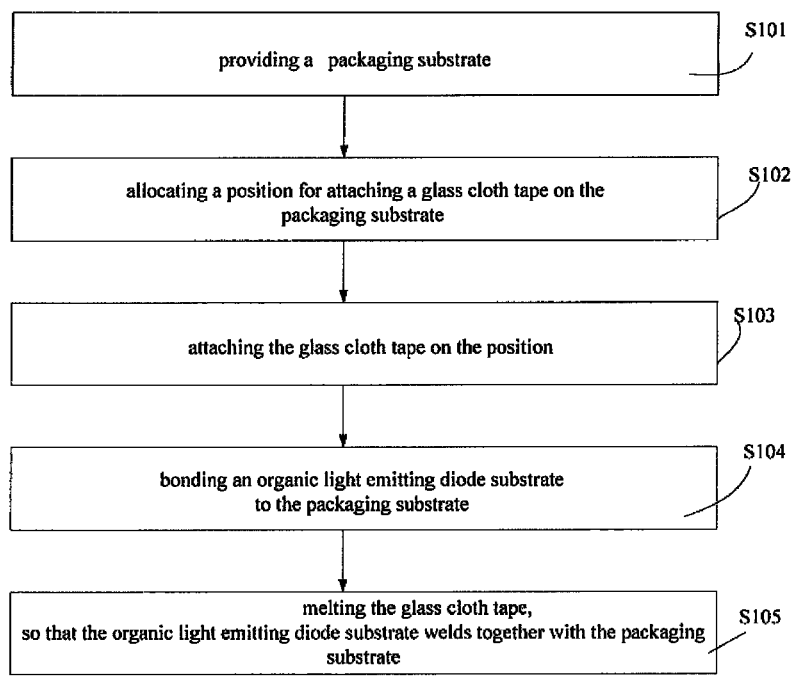
FIG. 1 is a flow chart of the implementation process of a first embodiment of the present invention, which provides a method for packaging an organic light emitting diode.

Please refer to FIG. 1, which is an implementation process of a first embodiment of the present invention, which provides a method for packaging an organic light emitting diode, which includes the following steps:

In step S101, providing a packaging substrate;

In step S102, allocating a position for attaching a glass cloth tape on the packaging substrate;

In step S103, attaching the glass cloth tape on the position;

In step S104, bonding an organic light emitting diode substrate to the packaging substrate;

In the embodiment of the present invention, the organic light emitting diode is placed above the organic light emitting diode substrate in advance; under vacuum, bonding an organic light emitting diode substrate to the packaging substrate, wherein the organic light emitting diode is placed the organic light emitting diode substrate, so that the organic light emitting diode is sealed between the organic light emitting diode substrate and the packaging substrate.

In step S105, melting the glass cloth tape, so that the organic light emitting diode substrate is welded together with the packaging substrate.

In the embodiment of the present invention, the glass cloth tape is laser melted, so that the organic light emitting diode substrate and the packaging substrate are welded together, and the internal and external of welding region are isolated, thereby preventing moisture and oxygen from entering from outside into the internal sealed region, in particular to achieve the implementation as follows:

A carbon dioxide laser or another suitable laser with a wavelength range of 800 nm~1200 nm is used. The focal length and focal spot sizes and the laser energy intensity are adjusted, so that the focal spot falls on the glass cloth tape, the focal spot of the carbon dioxide laser is moved along the glass cloth tape, so that the organic light emitting diode substrates are welded together with the packaging substrate.

As a preferred embodiment of the present invention, a melting point of the glass cloth tape is below 900° C. The thickness of the glass cloth tape is from 3 microns to 50 microns, preferably from 3.8 microns to 50 microns. The width of the glass cloth tape is from 200 microns to 2000 microns. The material of the glass cloth tape is the same as the organic light emitting diode substrate and the packaging substrate. The thermal expansion coefficient of the glass cloth tape is from 3.0 to 6.0, the unit is $10^{-6}$ m/K.

From the above, in the present embodiment, the glass cloth tape is attached on the packaging substrate, and the organic light emitting diode substrate and the packaging substrate are bonded together by using laser welding, so that the organic light emitting diode is sealed between the organic light emitting diode substrate and the packaging substrate. Since the glass cloth tape is smooth, the organic light emitting diode substrate contacts the packaging substrate fully, so as to avoid the appearance of welding cracks, so that outside gas cannot enter the interior of the package, which can effectively prevent moisture and oxygen from entering into the interior packaging body, thereby improving the lifetime of the OLED device. The glass cloth tape is readily available on the market, and is cheap; therefore, it can effectively reduce the welding costs of the OLED. Furthermore, by using glass cloth tape welding, the frit processes of coating sealant and frit processes of heating and drying can be omitted, and the sealing effect for moisture, oxygen is significantly improved, in addition, it is easy to implement.

Embodiment 2

Figure 2:
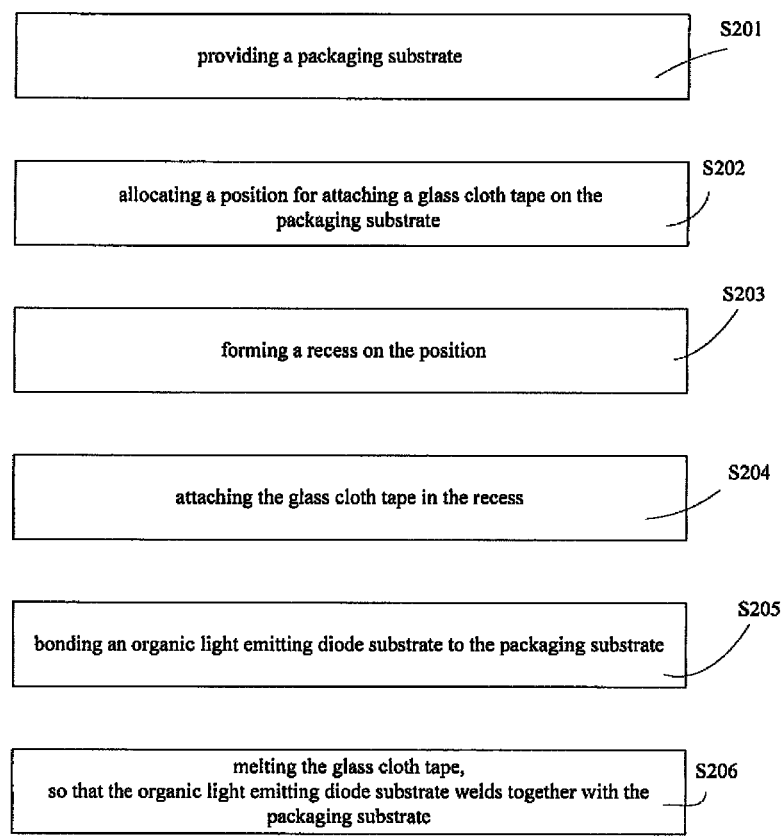
FIG. 2 is a flow chart of the implementation process of a second embodiment of the present invention, which provides a method for packaging an organic light emitting diode.

Please refer to FIG. 2, which is the implementation process of the second embodiment of the present invention, which provides a method for packaging an organic light emitting diode, which includes the following steps:

In step S201, providing a packaging substrate;
In step S202, allocating a position for attaching a glass cloth tape on the packaging substrate;
In step S203, forming a recess on the position;
In step S204, attaching the glass cloth tape in the recess;
In step S205, bonding an organic light emitting diode substrate to the packaging substrate.

In the embodiment of the present invention, the organic light emitting diode is placed above the organic light emitting diode substrate in advance; under vacuum, bonding an organic light emitting diode substrate to the packaging substrate, wherein the organic light emitting diode is placed the organic light emitting diode substrate, so that the organic light emitting diode is sealed between the organic light emitting diode substrate and the packaging substrate.

In step S206, melting the glass cloth tape, so that the organic light emitting diode substrate is welded together with the packaging substrate.

As a preferred embodiment of the present invention, the width of the recess is greater than the width of the glass cloth tape; the height of the recess is smaller than the thickness of the glass cloth tape. With such a design, it is possible to control the gap between the organic light emitting diode substrate and the packaging substrate.

In the embodiment of the present invention, by way of laser melting the glass cloth tape, the organic light emitting diode substrate and the packaging substrate are welded together, and the internal and external welding regions are isolated, thereby preventing moisture and oxygen from entering from outside into the internal sealed region. It is particularly implemented as following:

A carbon dioxide laser or another suitable laser with a wavelength range of 800 nm~1200 nm is used, the focal length and focal spot sizes and the laser energy intensity are adjusted, so that the focal spot falls on the glass cloth tape, the focal spot of the carbon dioxide laser is moved along the glass cloth tape, so that the organic light emitting diode substrates weld together with the packaging substrate.

As a preferred embodiment of the present invention, the glass cloth tape melting point is below 900° C. The thickness of the glass cloth tape is from 3 microns to 50 microns, preferably from 3.8 microns to 50 microns. The width of the glass cloth tape is from 200 microns to 2000 microns. The material of the glass cloth tape and the material of the organic light emitting diode substrate and the packaging substrate are the same. The thermal expansion coefficient of the glass cloth tape is from 3.0 to 6.0, the unit is $10^{-6}$ m/K.

Embodiment 3

Figure 3:
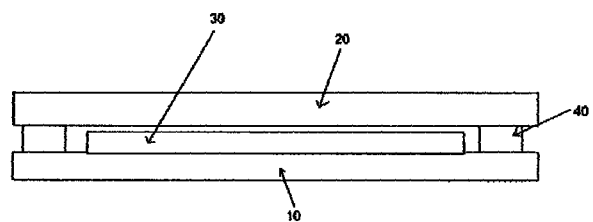
FIG. 3 is a schematic diagram of a structure of a third embodiment of the present invention, which provides a display device.
Figure 4:
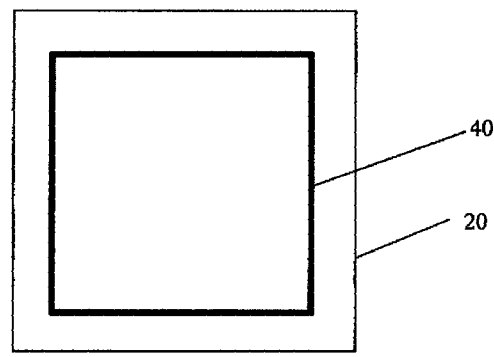
FIG. 4 is a schematic diagram of structure of the embodiment of the present invention, which provides a structure of a packaging substrate, on which a glass cloth tape is attached.

Please refer to FIG. 3 and FIG. 4, FIG. 3 is a schematic diagram of the structure of the third embodiment of the present invention, which provides a display device. FIG. 4 is a schematic diagram of the structure of embodiment of the present invention, which provides attaching the glass cloth tape on the packaging substrate. In order to facilitate explanation, only portions related to the embodiments of the present invention are shown.

The display device comprises: an organic light emitting diode substrate 10, a packaging substrate 20, an organic light emitting diode 30 disposed between the organic light emitting diode substrate 10 and the packaging substrate 20, and a glass cloth tape 40, the glass cloth tape 40 being located between the organic light emitting diode substrate 10 and the packaging substrate 20, and being located around the organic light emitting diode 30.

As a preferred embodiment of the present invention, a melting point of the glass cloth tape is below 900° C. The thickness of the glass cloth tape is from 3 microns to 50 microns, preferably from 3.8 microns to 50 microns. The width of the glass cloth tape is from 200 microns to 2000 microns. The material of the glass cloth tape and the material of the organic light emitting diode substrate and the packaging substrate are the same. The thermal expansion coefficient of the glass cloth tape is from 3.0 to 6.0, the unit is $10^{-6}$ m/K.

Embodiment 4

Figure 5:
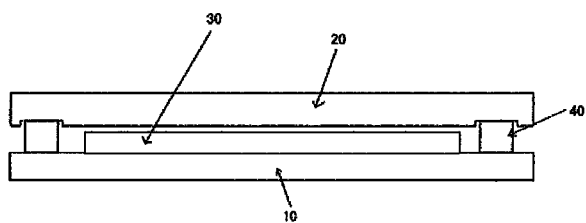
FIG. 5 is a schematic diagram of structure of a fourth embodiment of the present invention, which provides a display device.

Please refer to FIG. 5, which is a schematic diagram of the structure of the fourth embodiment of the present invention, which provides a display device. In order to facilitate explanation, only portions related to the embodiment of the present invention are shown.

The display device comprises: an organic light emitting diode substrate 10, a packaging substrate 20, an organic light emitting diode 30 disposed between the organic light emitting diode substrate 10 and the packaging substrate 20, and a glass cloth tape 40, the glass cloth tape 40 being located between the organic light emitting diode substrate 10 and the packaging substrate 20, and being located around the organic light emitting diode 30. Wherein, a recess 50 is disposed on the packaging substrate 20, the glass cloth tape 40 is disposed in the recess 50. However, it is understood that the recess can also be disposed on the organic light emitting diode substrate 10, and the glass cloth tape 40 disposed in the recess.

In the embodiment of the invention, the shape of the recess 50 can be designed according to actual requirements, any shape being able to embrace and seal the organic light emitting diode 30 is feasible.

As a preferred embodiment of the present invention, the width of the recess is greater than the width of the glass cloth tape; the height of the recess is smaller than the thickness of the glass cloth tape. With such a design, it is possible to control the gap between the organic light emitting diode substrate and the packaging substrate.

As a preferred embodiment of the present invention, the glass cloth tape melting point is below 900° C. The thickness of the glass cloth tape is from 3 microns to 50 microns, preferably from 3.8 microns to 50 microns. The width of the glass cloth tape is from 200 microns to 2000 microns. The material of the glass cloth tape and the material of the organic light emitting diode substrate and the packaging substrate are the same. The thermal expansion coefficient of the glass cloth tape is from 3.0 to 6.0, the unit $10^{-6}$ m/K.

From the above, the present embodiment provides the glass cloth tape which is attached on the packaging substrate, the organic light emitting diode substrate and the packaging substrate are bonded together by using laser welding, so that the organic light emitting diode is sealed between the organic light emitting diode substrate and the packaging substrate. Since the glass cloth tape is smooth, the organic light emitting diode substrate contacts the packaging substrate fully, thereby avoiding the appearance of welding cracks, so that outside gas cannot enter into the interior of the package, which can effectively prevent moisture and oxygen from entering into the interior packaging body. As a result, the lifetime of the OLED device is improved. The glass cloth tape is readily available on the market, and is cheap. Therefore, it can effectively reduce welding costs of OLED. Furthermore, by using glass cloth tape welding, the frit processes of coating sealant and frit processes of heating and drying can be omitted, and significantly improving the sealing effect for moisture and oxygen, which is easy to implement.

Despite the present invention has been shown and described in relation to one or more implementations, those skilled in the art, based on reading and understanding the specification and drawings, would expect equivalent variations and modifications. The present invention includes all such modifications and variations, and is only limited by the scope of the appended claims. Particularly with regard to the various functions performed by the above described components, the terms used to describe such components are intended to perform the function corresponding to the specified component (e.g., that is functionally equivalent) of any component (unless otherwise indicated), even if a structure is not the same as the disclosed structure which executes the functions of the exemplary implementations in the present specification. In addition, although a particular feature of this specification has been disclosed by only one of a number of implementations, this feature can be combined with one or more other combinations of features of other implementations for given or specific applications as desired and advantageously. Furthermore, the terms "including", "having", "containing", or variations thereof are used in the detailed description or the claims, such terms are intended to be used in a manner similar to the term "comprising".

In summary, although the present invention has been described in preferred embodiments above, the preferred embodiments described above are not intended to limit the invention. One of ordinary skill in the art without departing from the spirit and scope of the invention can make all species of modifications and variations, so the protection scope of the invention is defined by the claims.

What is claimed is:

1. A method for packaging an organic light emitting diode, comprising:
   providing a packaging substrate;
   allocating a position for attaching a glass cloth tape on the packaging substrate;
   attaching the glass cloth tape on the position; and
   bonding an organic light emitting diode substrate to the packaging substrate, wherein the organic light emitting diode substrate has the organic light emitting diode disposed thereon;
   welding the organic light emitting diode substrate and the packaging substrate together by using a laser to melt the glass cloth tape.

2. The method for packaging an organic light emitting diode according to claim 1, after the step of allocating the position for attaching the glass cloth tape on the packaging substrate, further comprising:
   forming a recess on the position;
   and wherein the step of attaching the glass cloth tape on the position comprises:
   attaching the glass cloth tape in the recess.

3. The method for packaging an organic light emitting diode according to claim 1, wherein the step of melting the glass cloth tape by the laser comprises:
   using a carbon dioxide laser with a wavelength range of 800 nm~1200 nm, adjusting a focal length, a focal spot size and a laser energy intensity thereof, so that the focal spot falls on the glass cloth tape, moving the focal spot of the carbon dioxide laser along the glass cloth tape, so that the organic light emitting diode substrate and the packaging substrate are welded together.

4. A method for packaging an organic light emitting diode, wherein the method comprises the steps of:
   providing a packaging substrate;
   allocating a position for attaching a glass cloth tape on the packaging substrate;
   attaching the glass cloth tape on the position;
   bonding an organic light emitting diode substrate to the packaging substrate; and
   melting the glass cloth tape, so that the organic light emitting diode substrate welds together with the packaging substrate.

5. The method for packaging an organic light emitting diode according to claim 4, wherein a step after allocating a position for attaching a glass cloth tape on the packaging substrate, comprises the step of:
   forming a recess on the position; and
   the step of attaching the glass cloth tape on the position, which comprises:
   attaching the glass cloth tape in the recess.

6. The method for packaging an organic light emitting diode according to claim 4, wherein the step of melting the glass cloth tape, comprising:
   melting the glass cloth tape by a laser.

7. The method for packaging an organic light emitting diode according to claim 6, wherein the step of the laser melting the glass cloth tape, comprises:
   using a carbon dioxide the laser with a wavelength range of 800 nm~1200 nm, adjusting the focal length and focal spot sizes and the laser energy intensity, so that the focal spot falls on the glass cloth tape, moving the focal spot of the carbon dioxide laser along the glass cloth tape, so that the organic light emitting diode substrates welds together with the packaging substrate.

* * * * *